United States Patent
Lee et al.

[19]
[11] Patent Number: 5,907,174
[45] Date of Patent: *May 25, 1999

[54] ELECTROSTATIC DISCHARGE PROTECTING TRANSISTOR

[75] Inventors: Woo Bong Lee; Se Jun Oh; Tae Jung Yeo; Jae Wan Ko; Yung Mo Koo, all of Bubaleub, Rep. of Korea

[73] Assignee: Hyundai Electronics Industries Co., Ltd., KyoungKido, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/652,949

[22] Filed: May 24, 1996

Related U.S. Application Data

[62] Division of application No. 08/326,880, Oct. 21, 1994, Pat. No. 5,545,572.

[30] Foreign Application Priority Data

Oct. 21, 1993 [KR] Rep. of Korea ............... 93-21959

[51] Int. Cl.⁶ ................................................ H01L 23/62
[52] U.S. Cl. .................. 257/357; 257/355; 257/356; 257/360; 257/361
[58] Field of Search ........................ 257/355, 356, 257/357, 360, 361, 345

[56] References Cited

U.S. PATENT DOCUMENTS

| | | | |
|---|---|---|---|
| 4,101,922 | 7/1978 | Tihanyi et al. | 357/23 |
| 4,128,439 | 12/1978 | Jambotkar | 148/1.5 |
| 4,400,711 | 8/1983 | Avery | 357/43 |
| 4,605,980 | 8/1986 | Hartranft et al. | 361/56 |
| 4,734,752 | 3/1988 | Liu et al. | 357/23.4 |
| 4,990,976 | 2/1991 | Hattori | 357/23.4 |
| 5,019,888 | 5/1991 | Scott et al. | 357/41 |
| 5,162,888 | 11/1992 | Co et al. | 257/408 |
| 5,371,395 | 12/1994 | Hawkins | 257/361 |

FOREIGN PATENT DOCUMENTS

| | | | |
|---|---|---|---|
| 598146 | 5/1994 | European Pat. Off. | 257/355 |
| 598146A1 | 5/1994 | European Pat. Off. | 257/355 |
| 56-73468 | 6/1981 | Japan | 257/345 |
| 58-62067 | 9/1983 | Japan . | |
| 60-50960 | 3/1985 | Japan | 257/345 |
| 1-10657 | 1/1989 | Japan . | |
| 4-71275 | 5/1992 | Japan . | |
| 5-36909 | 2/1993 | Japan . | |
| 2 247 779 | 3/1992 | United Kingdom | 257/356 |

OTHER PUBLICATIONS

C.G. Jambotkar, et al., High Voltage MOSFET Structure:, IBM Tech. Discl. Bulletin, vol. 23, No. 11, 1981, p. 4988.

B. Krabbenborg, et al., Physics of Electro–Thermal Effects in ESD Protection Devices:, *J. Electrostatics,* 28 (1992), pp. 285–299.

B. Krabbenborg, et al., J. Electrostatics, 28(1992) 285 Physics of Electro–Thermal Effects in ESD Protection Devices.

Translation of JP 64–10657, Furnished with Previous Office Action.

Translation of JP 5–36909, Furnished with Previous Office Action.

C.G. Jambotkar et al., IBM Tech. Discl. Bulletin, 23(11) 1981,4988 "High Voltage MOSFET Structure".

S. Wolf, "Silicon Processing for the VLSI ERA", vol. II, pp. 441–446.

*Primary Examiner*—Mahshid Saadat
*Assistant Examiner*—Allan R. Wilson
*Attorney, Agent, or Firm*—Merchant, Gould, Smith, Edell, Welter & Schmidt, P.A.

[57] ABSTRACT

An electrostatic discharge (ESD) protecting transistor and a method for fabricating the same, capable of consuming a high voltage or overcurrent applied to a semiconductor circuit device and thereby protecting the circuit device from the high voltage or overcurrent. The ESD protecting transistor is of an asymmetric charge coupled MOS transistor structure having a highly doped buried layer capable of dispersing a current flux, thereby removing an instant ESD impact and reducing generation of heat caused by a concentration of high current flux. Accordingly, an effect of improving the resistance characteristic to the ESD impact is provided.

6 Claims, 4 Drawing Sheets

ELECTROSTATIC DISCHARGE PROTECTING TRANSISTOR

This is a Divisional of application Ser. No. 08/326,880, filed Oct. 21, 1994 now U.S. Pat. No. 5,545,572 issued Aug. 13, 1996.

BACKGROUND OF THE INVENTION

1. Field of the Invention

The present invention relates to electrostatic discharge (ESD) protecting circuit capable of consuming a high voltage or overcurrent applied to a semiconductor circuit device and thereby protecting the circuit device from the high voltage or overcurrent, and more particularly to a transistor of such an ESD protecting circuit comprising an asymmetric charge coupled MOS thick film transistor having a highly-doped buried layer, capable of improving the characteristic thereof and the resistance characteristic to an ESD impact.

2. Description of the Prior Art

As semiconductor devices have a higher integration degree, the resistance characteristic to ESD impact is degraded because of the use of a lightly doped drain (LDD) structure and a shallow junction and the use of titanium silicide ($TiSi_2$). For fabrication of semiconductor devices of the next generation, however, it is required that there be improvements in resistance characteristics to ESD impact.

For satisfying such a requirement, there has been proposed an ESD protecting circuit adapted to protect an internal circuit of a semiconductor circuit device from an external ESD impact. FIG. 1 is a circuit diagram illustrating such an ESD protecting circuit.

As shown in FIG. 1, the ESD protecting circuit includes a first transistor 100 which is a thick film transistor adapted to be turned on when a positive ESD impact is applied to an input of the circuit device. At the turned-on state, the first transistor 100 provides a bypass for allowing the positive ESD impact to be bypassed without giving any damage to the internal circuit. The first transistor 100 has a threshold voltage of about 15V or greater. The ESD protecting circuit also includes a second transistor 200 which is a thin film transistor serving as a bypass for bypassing a negative ESD impact.

The present invention concerns the application of the first, thick film transistor of the above-mentioned ESD protecting circuit. As representative of conventional techniques about the above-mentioned application, there have been two known techniques which are illustrated in FIGS. 2 and 3, respectively.

In the case of FIG. 2, the traditional thick film transistor 100 includes doped source/drain contact regions (source/drain electrodes) 24 and a gate oxide layer 28. By this connection structure, an N type channel is formed in a portion of a P type substrate 21 disposed beneath the gate oxide layer 28, when a positive ESD impact is externally applied to the transistor 100. The N type channel serves as a bypass for bypassing the positive ESD impact. At this time, the thick film transistor 100 is operated in an inversion mode. As a result, the N type channel is formed on the upper surface of the P type substrate. This results in a limitation on the maximum channel width.

Consequently, the conventional technique has a drawback of limiting the maximum current discharged through the channel because electrons can flow (in the direction of arrow 30) only through the channel inverted. In other words, there is a limitation on removal of the ESD impact. Due to the residue of ESD impact over the limit, the ESD protecting circuit itself or the internal circuit of the circuit device may be damaged. As a result, the ESD protecting circuit may not achieve its protection function.

Furthermore, where a particular metal such as titanium silicide is used in fabrication of a highly integrated semiconductor device to reduce the metal-substrate contact resistance, the resistance characteristic to ESD impact is greatly reduced.

For solving the drawback encountered in the above-mentioned traditional thick transistor structure, the technique illustrated in FIG. 3 has been proposed which uses a thyristor.

The technique of FIG. 3 utilizes a rapid bipolar characteristic of the thyristor having a PNPN structure. In this case, complex process steps are additionally required for fabrication of the thyristor, even though a superior resistance characteristic to ESD impact is obtained.

For this reason, such a transistor employing the thyristor has seldom been used in the case of a mass-produced semiconductor devices.

In FIGS. 2 and 3, the reference numerals 22 and 32 denote gate oxide films, respectively, reference numerals 25 and 30 denote electrodes while the reference numerals 23, 33 denote insulating films, respectively. Also, the reference numeral 34 denotes a source/drain, 36 a well, 37 a p+ region and 38 a gate oxide layer.

SUMMARY OF THE INVENTION

Therefore, an object of the invention is to solve the above-mentioned problems encountered in the prior art and, thus, to provide a transistor of an ESD protecting circuit for a semiconductor circuit device capable of achieving an improvement in resistance characteristics to ESD impact.

In accordance with one aspect, the present invention provides a transistor of an electrostatic discharge protecting circuit for a semiconductor device comprising a semiconductor substrate, a source, a drain and a channel region defined between the source and the drain, the transistor further comprising: a highly doped buried layer formed of a predetermined region of the semiconductor substrate disposed beneath the channel region, the buried layer having an asymmetric structure such that it is disposed near one of the source and the drain, whereby the buried layer is easily connected to the source or the drain.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

The present invention will be described in conjunction with FIG. 4 and FIGS. 5A to 5D.

The present invention concerns a technique embodying an asymmetric charge coupled MOS thick film transistor having a highly-doped buried layer in order to improve the resistance characteristic to an ESD impact.

Figure 1:
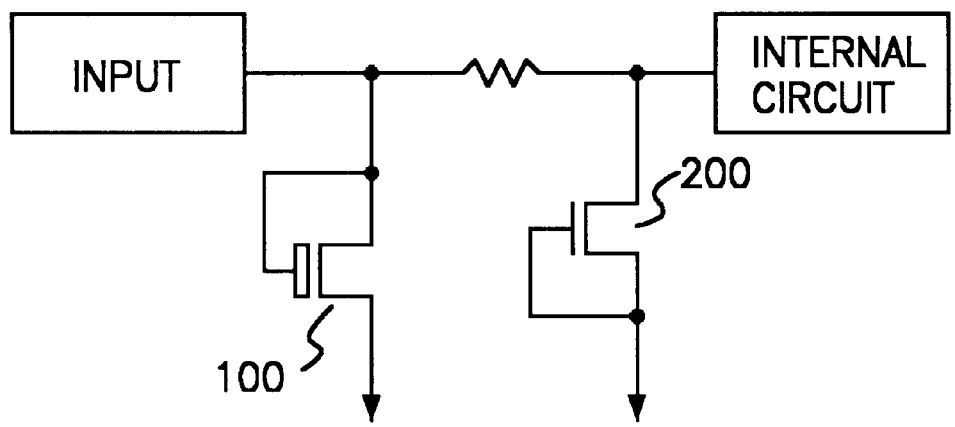
FIG. 1 is a circuit diagram illustrating a conventional ESD protecting circuit.
Figure 2:
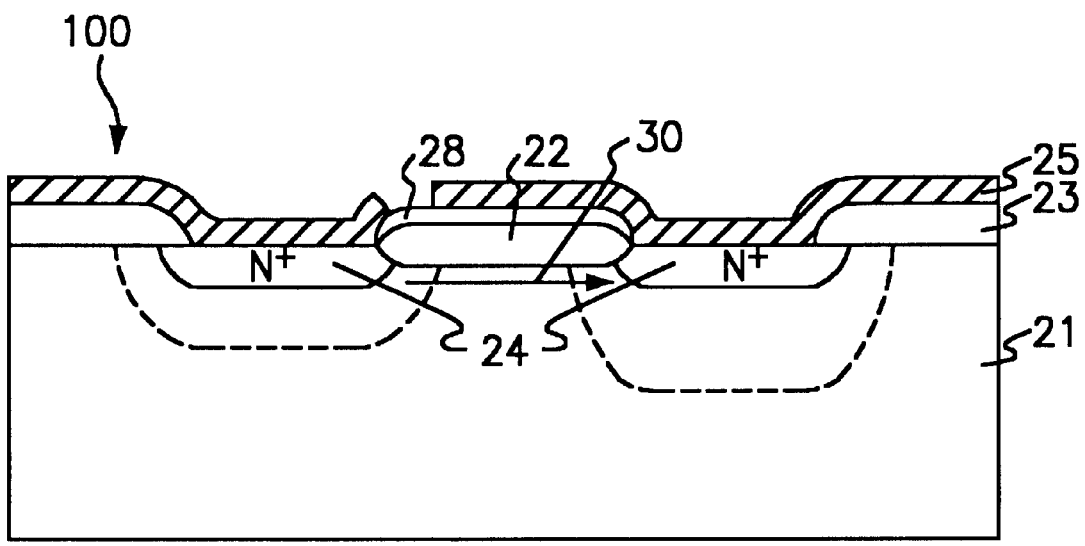
FIG. 2 is a sectional view illustrating a thick film transistor structure employed for the conventional ESD protecting circuit.
Figure 3:
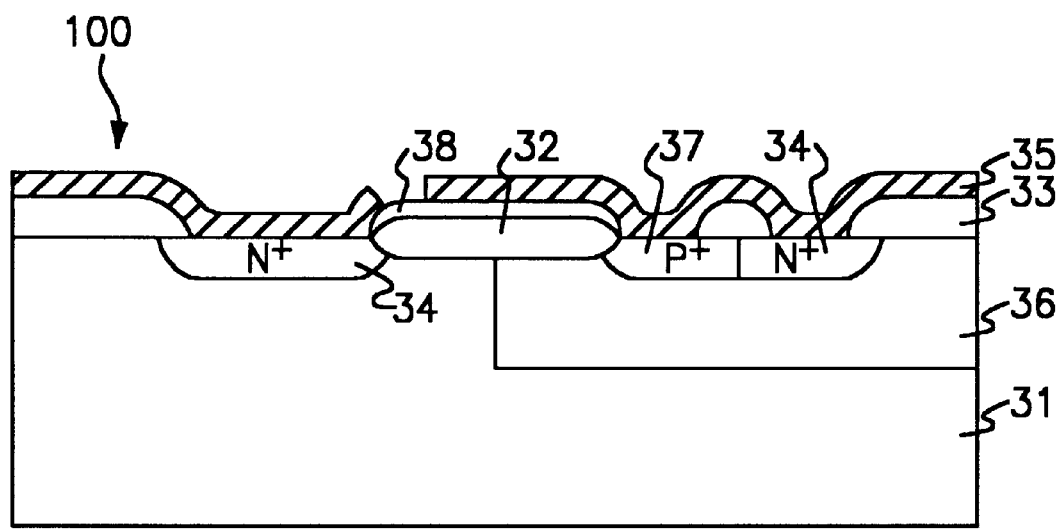
FIG. 3 is a sectional view illustrating another thick film transistor structure employed for the conventional ESD protecting circuit, using a thyristor.
Figure 4:
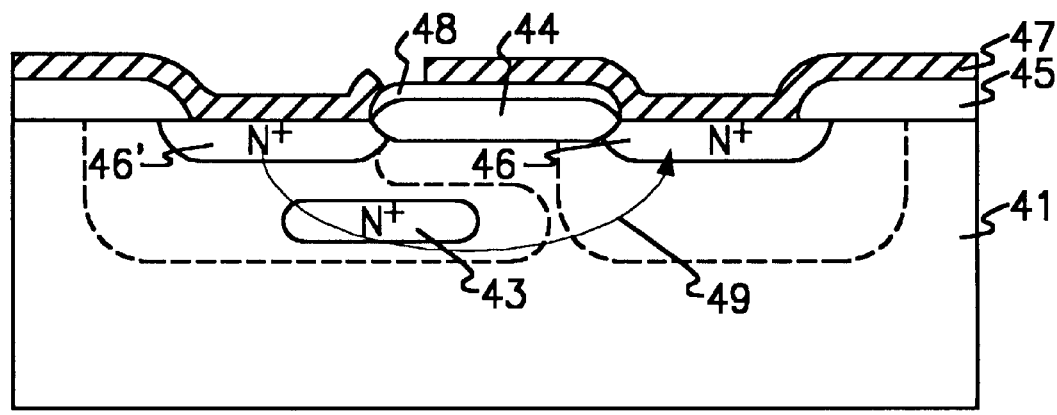
FIG. 4 is a concept diagram illustrating a thick film transistor structure employed for an ESD protecting circuit in accordance with the present invention and a flow of electrons in the transistor structure.

FIG. 4 is a concept diagram illustrating a structure of the thick film transistor in accordance with the present invention and a flow of electrons in the transistor structure.

As shown in FIG. 4, the thick film transistor includes a semiconductor substrate 41, a highly doped buried layer 43 formed in the semiconductor substrate 41, a gate oxide film 44 and a gate electrode 48, and drain and source electrodes 46 and 46' and a conduction film 47 formed in the upper surface portion of the semiconductor substrate 41. The buried layer 43 is formed in an asymmetric manner such that it is positioned toward the source electrode 46'. By such an asymmetric structure, the source electrode 46' can be easily coupled to the buried layer 43 even when a small extension of a depletion layer is generated. When an ESD impact of high voltage is externally applied to the drain electrode 46, the depletion layer extends abruptly at a high concentration N type junction so that it comes into contact with the buried layer 43 of the high concentration N type. As a result, electrons flow in a direction indicated by an arrow 49 of FIG. 4, that is, from the source electrode 46' to the buried layer 43 and then from the buried layer 43 to the drain electrode 46. The device shown in FIG. 4 includes a gate electrode, but this gate electrode is not shown simultaneously with the source/drain electrodes due to the nature of the cross sectional view.

In the asymmetric charge coupled thick film MOS transistor having the highly doped buried layer, accordingly, current is dispersed through two passages, thereby enabling the ESD impact to be easily removed. By virtue of the dispersion of current flux, the amount of heat generated is small. As a result, it is possible to avoid a damage of the semiconductor device caused by the heat. Since the buried layer is asymmetrically formed such that it is disposed near the source electrode, a flow of current through the buried layer is inhibited during a normal operation of the semiconductor device when a low voltage is applied to the drain electrode. As a result, the thick film transistor of the ESD protecting circuit has a sufficient OFF characteristic required in the normal operation of the semiconductor device.

FIGS. 5A to 5D are sectional views respectively illustrating the transistor having the above-mentioned structure, in particular, the N type MOS transistor structure with the buried layer in accordance with the present invention.

Figure 5A:
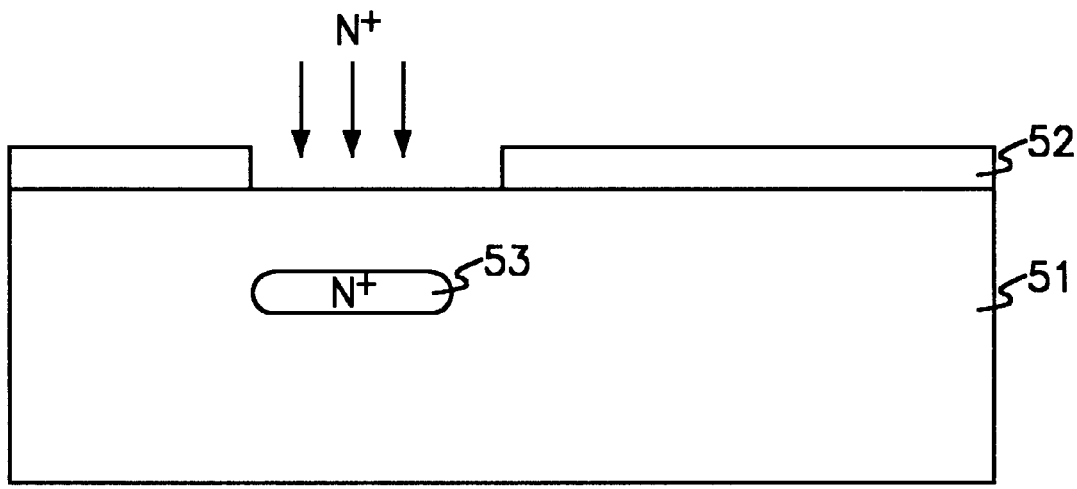
FIGS. 5A to 5D are sectional views respectively illustrating the transistor structure for the ESD protecting circuit shown in FIG. 4 in accordance with the present invention.

FIG. 5A shows formation of a highly doped buried layer in accordance with the present invention. In order to form the highly doped buried layer, first, a photoresist film 52 is coated over a P type semiconductor substrate 51, as shown in FIG. 5A. Thereafter, a masking process is carried out so as to etch a predetermined portion of the photoresist film 52 until the semiconductor substrate 51 is partially exposed through the etched portion of the photoresist film 52. N type impurity ions are then implanted in a high concentration in the exposed portion of the semiconductor substrate 51, thereby forming a buried layer 53 in the semiconductor substrate 51. The buried layer 53 is formed in an asymmetric manner such that it is disposed near a source electrode. The buried layer 53 serves to cut off a flow of current therethrough during a normal operation of the semiconductor device that a low voltage is applied to a drain electrode.

Figure 5B:
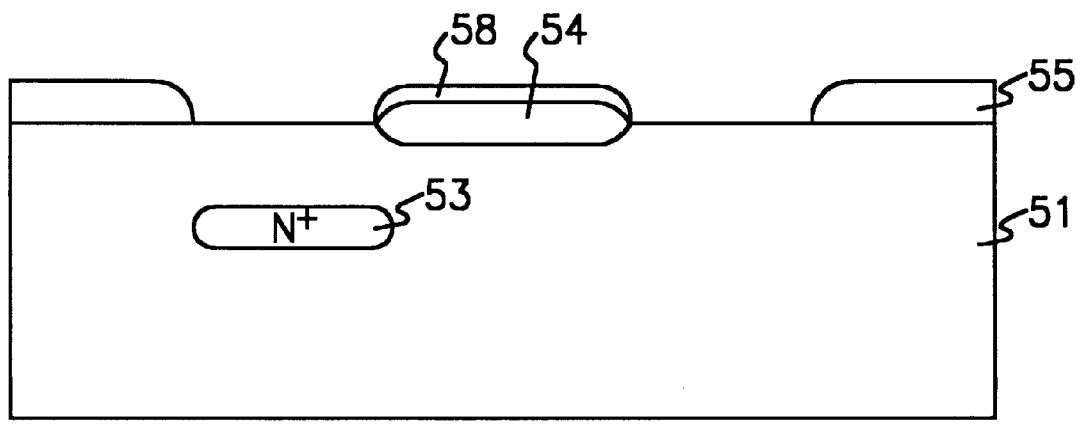

Subsequently, the photoresist film 52 is completely removed, as shown in FIG. 5B. On the resulting structure, a gate oxide film 54 and a gate oxide layer 58 are then formed in a sequential manner. Over the entire exposed upper surface of the resulting structure, an oxide film 55 is then formed. Thereafter, a masking process is carried out so as to expose predetermined portions of the semiconductor substrate 51 respectively corresponding to electrode regions for a source electrode and a drain electrode to be subsequently formed.

Figure 5C:
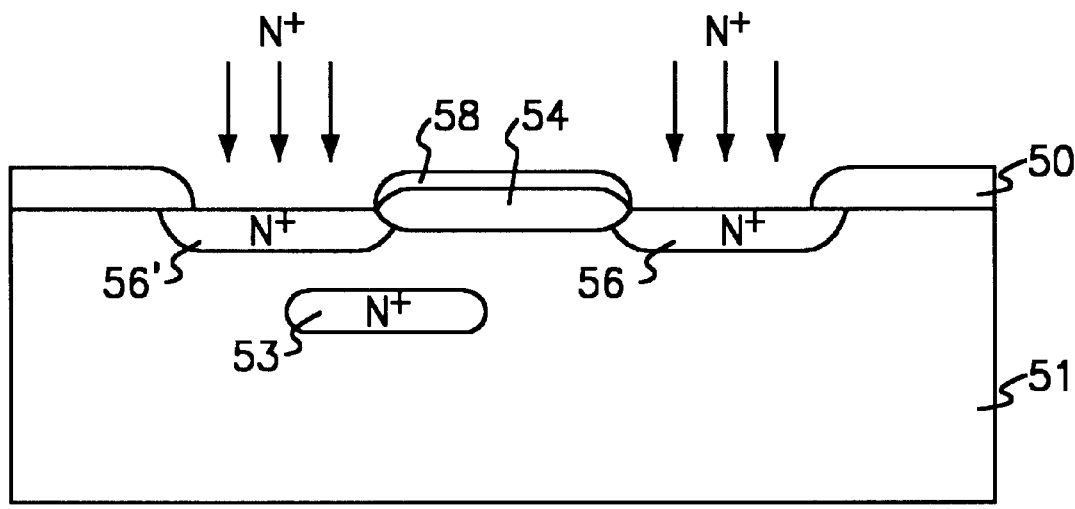

As shown in FIG. 5C, N type impurity ions are then implanted in the electrode regions defined at the step of FIG. 5B, thereby forming a source electrode 56' and a drain electrode 56.

Figure 5D:
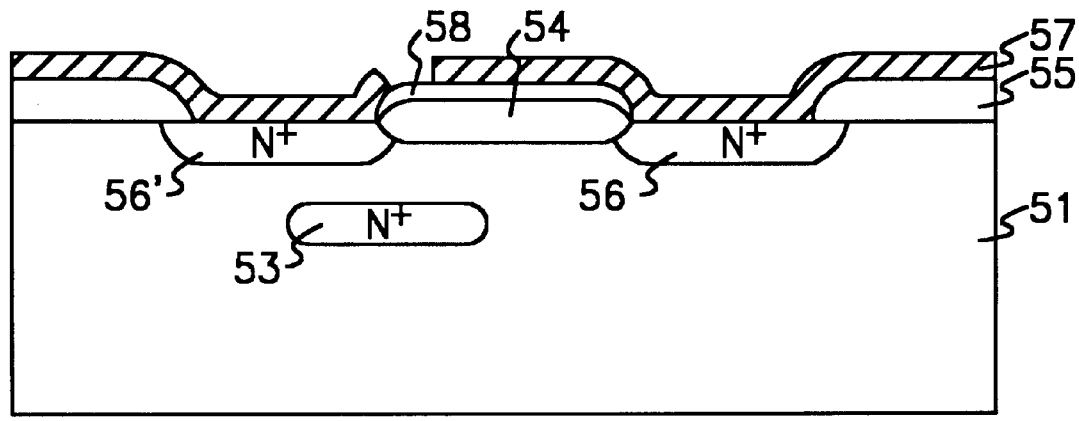

Thereafter, a metal film 57 is deposited over the entire exposed upper surface of the resulting structure (FIG. 5D). A masking process is then carried out so as to connect the drain electrode 56 to the gate oxide layer 58. Thus, a thick film transistor is obtained. The device shown in FIGS. 5A–5D includes gate electrodes, but the gate electrodes are not shown simultaneously with the source/drain electrodes due to the nature of the cross sectional views.

As apparent from the above description, the present invention provides a transistor of an ESD protecting circuit for a semiconductor circuit device which comprises an asymmetric charge coupled MOS transistor having a highly doped buried layer capable of dispersing a current flux and thereby removing an instant ESD impact and reducing generation of heat caused by a concentration of high current flux. Accordingly, the present invention provides an effect of improving the resistance characteristic to the ESD impact.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A MOS transistor of an electrostatic discharge protecting circuit, comprising:

a gate insulating layer, a first active region, a second active region, a gate electrode, and a buried depletion region expanding layer formed at least partly below the first active region and beyond the first active region to below no more than a portion of the gate insulating layer, the first active region, the second active region and the depletion region expanding layer being doped with a first doping type such that the depletion region expanding layer and the first active region form an active depletion region when the transistor turns on by virtue of a high voltage applied from an external power supply to an internal circuit so that current over an electrostatic discharge protecting circuit limit flows from the first active region through the depletion region expanding layer to the second active region.

2. A MOS transistor in accordance with claim 1, wherein the MOS transistor is a NMOS transistor.

3. A MOS transistor in accordance with claim 2, wherein the first active region is a source region and the second active region is a drain region.

4. A MOS transistor in accordance with claim 3, wherein the drain region and the gate electrode are coupled to the external power supply and the source region is coupled to a ground level.

5. A MOS transistor in accordance with claim 2, wherein the depletion region expanding layer is a heavily n-type doped layer.

6. A MOS transistor in accordance with claim 1, wherein the depletion region expanding layer extends below no more than a part of the first active region.

* * * * *